United States Patent
Kim et al.

(10) Patent No.: US 8,630,096 B2
(45) Date of Patent: Jan. 14, 2014

(54) LARGE CAPACITY MEMORY MODULE MOUNTING DEVICE FOR PORTABLE TERMINAL

(75) Inventors: Yu-Su Kim, Gyeonggi-do (KR);
Kyu-Sub Kwak, Suwon-si (KR);
Young-Min Lee, Yongin-si (KR);
Shi-Yun Cho, Anyang-si (KR);
Jae-Hyuck Lee, Anyang-si (KR); Se-Ho Park, Suwon-si (KR); Youn-Ho Choi, Seoul (KR); Seung-Woo Han, Seoul (KR); Ji-Hyun Jung, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 238 days.

(21) Appl. No.: 13/050,378

(22) Filed: Mar. 17, 2011

(65) Prior Publication Data
US 2011/0228490 A1 Sep. 22, 2011

(30) Foreign Application Priority Data
Mar. 18, 2010 (KR) .................. 10-2010-0024254

(51) Int. Cl.
*H05K 1/00* (2006.01)
*H05K 3/32* (2006.01)
(52) U.S. Cl.
CPC .................................. *H05K 3/323* (2013.01)
USPC ........................................ 361/749; 361/752
(58) Field of Classification Search
USPC .......... 361/749, 752, 785, 791, 756; 439/660, 439/76.1, 946, 945
See application file for complete search history.

(56) References Cited

U.S. PATENT DOCUMENTS

| | | | | |
|---|---|---|---|---|
| 5,637,418 A | * | 6/1997 | Brown et al. | 429/127 |
| 6,043,557 A | * | 3/2000 | Phelps et al. | 257/668 |
| 7,091,731 B1 | * | 8/2006 | Holcombe et al. | 324/754.07 |
| 7,347,736 B2 | * | 3/2008 | Ni | 439/660 |
| 2003/0186719 A1 | | 10/2003 | Yamaguti et al. | |
| 2005/0197014 A1 | | 9/2005 | Kim et al. | |
| 2007/0170425 A1 | * | 7/2007 | Tashiro et al. | 257/48 |
| 2007/0211426 A1 | * | 9/2007 | Clayton et al. | 361/689 |

FOREIGN PATENT DOCUMENTS

| | | |
|---|---|---|
| JP | 2003-288565 | 10/2003 |
| JP | 2003288565 | * 10/2003 |
| JP | 2005-045489 | 2/2005 |
| KR | 1020010069358 A | 7/2001 |
| KR | 1020090080702 A | 7/2009 |

* cited by examiner

*Primary Examiner* — Yuriy Semenenko
(74) *Attorney, Agent, or Firm* — The Farrell Law Firm, P.C.

(57) ABSTRACT

A large capacity memory module mounting device employed in a portable terminal is provided, including a large capacity memory module including a plurality of first contact pads; and a flexible circuit board including a plurality of second contact pads and electrically connected to the large capacity memory module by forming solder pads in a heating process after the first and second contact pads are positioned in a face-to-face manner. Accordingly, the large capacity memory module can be advantageously mounted to the portable terminal and an electromagnetic field can be effectively shielded.

11 Claims, 2 Drawing Sheets

LARGE CAPACITY MEMORY MODULE MOUNTING DEVICE FOR PORTABLE TERMINAL

PRIORITY

This application claims priority under 35 U.S.C. §119(a) to an application entitled "Large Capacity Memory Module Mounting Device For Portable Terminal" filed in the Korean Intellectual Property Office on Mar. 18, 2010 and assigned Serial No. 10-2010-0024254, the entire disclosure of which is incorporated herein by reference.

BACKGROUND OF THE INVENTION

1. Field of the Invention

The present invention generally relates to a portable terminal, and more particularly, to a large capacity memory module mounting device adapted to consider a mounting space efficiency of a portable terminal.

2. Description of the Related Art

In general, in order to mount a large capacity memory module provided as a user memory in a storage device of a portable terminal including a cellular phone, a smart phone, and a Personal Digital Assistant (PDA), a memory of Ball Grid Array (BGA) type is manufactured in the form of a package to be directly mounted to a main board of the portable terminal or mounted to a sub-board through a Surface Mounting Device (SMD) process using a separate flexible circuit board.

Due to the advent of the multimedia environment, it has been necessary to mount large capacity memory modules to portable terminals, but a package of a large capacity memory module is so large that when mounted to a main board of a portable terminal, it occupies a large amount of mounting space, causing restrictions on arrangement of various parts. In particular, when a large capacity memory module is mounted using a sub-board, the entire thickness of the module including the sub-board becomes thicker, causing restrictions to an arranging space in the mechanism and making the entire thickness of a portable terminal greater.

FIG. 1 is a top view illustrating a conventional large capacity memory module mounting device. As illustrated in FIG. 1, the conventional memory module mounting device has a structure in which a large capacity memory module 10 is positioned on a sub-board 12 to face the sub-board 12 and is connected to the sub-board 12 through an SMD process, and the sub-board 12, to which the large capacity memory module 10 is connected, is electrically connected to a main board of a portable terminal (not shown) by a connector 15 provided at an end of a flexible circuit board 14. The sub-board 12 is positioned at a proper position within the portable terminal.

The structure has a large thickness due to the sub-board and the large capacity memory module, so a large space is required to mount them in the portable terminal, which is problematic with respect to mounting efficiency. In particular, when the large capacity memory module package is of a BGA type, a thickness of the package connected to a sub-board becomes larger, causing restrictions on mounting space. As a result, this can increase the thickness of a portable terminal.

SUMMARY OF THE INVENTION

Accordingly, the present invention has been made to solve the above-mentioned problems occurring in the prior art, and an aspect of the present invention provides a large capacity memory module mounting device of a portable terminal that improves mounting space efficiency in a portable terminal and is easily attached and detached to and from a desired object of the portable terminal.

Another aspect of the present invention provides a large capacity memory module mounting device of a portable terminal that has a slim structure to enhance a mounting space efficiency of another part.

Another aspect of the present invention provides a large capacity memory module mounting device of a portable terminal that is excellent in electromagnetic field shielding effect.

In accordance with an aspect of the present invention, there is provided a large capacity memory module mounting device of a portable terminal, including a large capacity memory module including a plurality of first contact pads; and a flexible circuit board including a plurality of second contact pads and electrically connected to the large capacity memory module by forming solder pads in a heating process after the first and second contact pads are positioned in a face-to-face manner.

In accordance with another aspect of the present invention, there is provided a large capacity memory module mounting device of a portable terminal, including a large capacity memory module; a flexible circuit board connected to the large capacity memory module; a conductive material attached to the large capacity memory module; and a shield connected to the large capacity memory module by the conductive material.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF EMBODIMENTS OF THE PRESENT INVENTION

Figure 1:
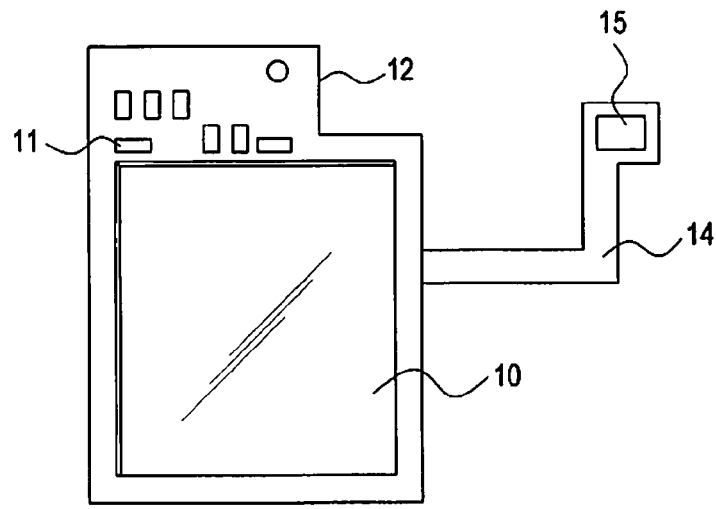
FIG. 1 is a top view illustrating a conventional large capacity memory module mounting device.

Hereinafter, embodiments of the present invention will be described with reference to the accompanying drawings. In the following description, the same elements will be designated by the same reference numerals although they are shown in different drawings.

Figure 2:
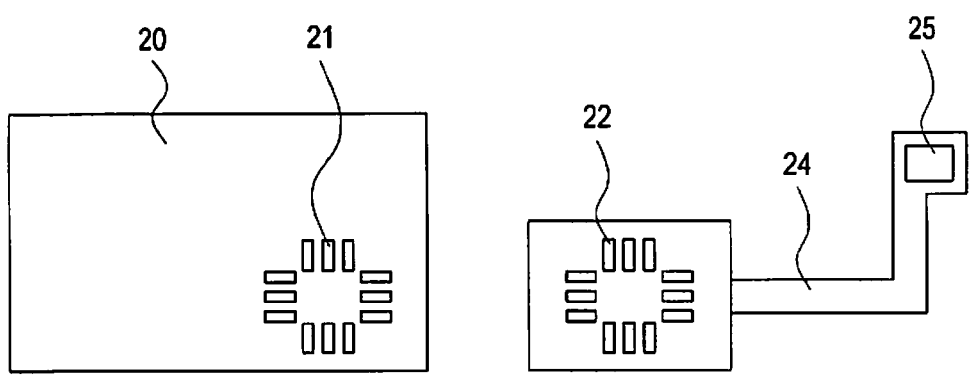
FIG. 2 is a top view illustrating a large capacity memory and a flexible circuit board of a large capacity memory module mounting device according to an embodiment of the present invention.
Figure 3:
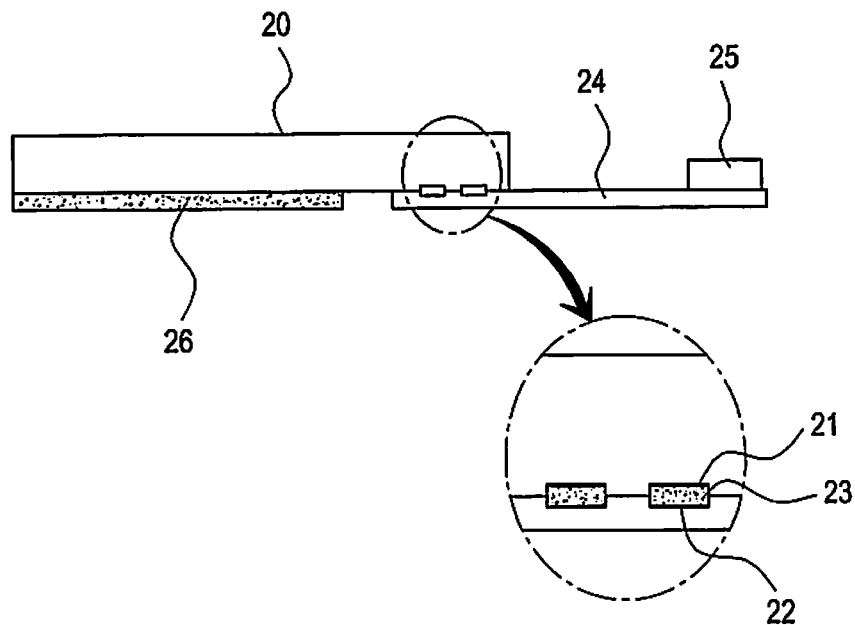
FIG. 3 is a side view illustrating a large capacity memory module mounting device according to the embodiment of the present invention.

As illustrated in FIGS. 2 and 3, a large capacity memory module mounting device according to an embodiment of the present invention is a storage device in a small-sized, light, and thin electronic device, and includes a large capacity memory module 20 a flexible circuit board 24 configured to electrically connect the large capacity memory module 20 to a main board (not shown) of a portable terminal directly, a unit configured to directly connect the large capacity memory module 20 and the flexible circuit board 24 in a face-to-face manner. In particular, the large capacity memory module mounting device according to the embodiment of the present invention is manufactured through a hot bar process or Anisotropic Conductive Film (ACF) process, which is described below.

The large capacity memory module 20 is a storage unit employed in a portable terminal, and may include a large capacity memory package having a memory die (i.e., a block of semiconducting material), a controller, a plurality of passive elements or an embedded printed circuit board package. The large capacity memory module 20 includes a plurality of first contact pads 21 on a certain surface region. The first contact pads 21 are arranged in a certain surface region of the large capacity memory module with a flat contact surface being exposed in a predetermined thickness. In particular, each first contact pads 21 may include a Test Pin (TP) pad for Failure Mode Analysis (FMA).

The flexible circuit board 24 is a connection unit configured to electrically connect the large capacity memory module 20 positioned at a desired position to the main board of the portable terminal. A plurality of below-described contact pads 22 are provided at one end of the flexible circuit board 4 and a connector 25 connected to the main board of the portable terminal is provided at an opposite end thereof. The connector 25 has a slim shape. The plurality of contact pads 22 of the flexible circuit board 24 correspond to the first contact pads 21. The second contact pads 22 are configured to correspond to the first contact pads 21 in a one end region of the flexible circuit board 24, and a flat contact surface with a predetermined thickness exposed.

After the large capacity memory module 20 and the flexible circuit board 24 are positioned to directly contact with each other in a face-to-face manner. More specifically, after the first and second contact pads 21 and 22 are positioned to face each other, they are connected in a heating process, preferably, a hot bar or an ACF process. FIG. 3 illustrates a state in which the large capacity memory module 20 and the flexible circuit board 24 have contact with each other after the process. Referring to FIG. 3, the large capacity memory module 20 and the flexible circuit board 24 are positioned to directly contact with each other in a face-to-face manner, and solder pads 23 are formed between the first contact pads 21 and the second contact pads 22. The solder pads 23 connect the first and second contact pads 21 and 22. The solder pads 23 are formed in spaces between the first and second contact pads 21 and 22 without adding to the thicknesses of the large capacity memory module 20 and the flexible circuit board 24. That is, the solder pads 23 produced by the hot bar or ACF process contribute to the slimness of the portable terminal while connecting the first and second contact pads 21 and 22.

As illustrated in FIG. 3, the large capacity memory module 20, which is connected to the flexible circuit board is attached and mounted to a desired object of the portable terminal using double-sided tape 26. The desired object of the portable terminal may be one of a spare space within the body housing of the portable terminal, a shield can, a battery pack, and an Liquid Crystal Display (LCD) module. Thus, a large capacity memory module may be detachably mounted to a desired object safely by adjusting the width and length of the flexible circuit board.

Figure 4:
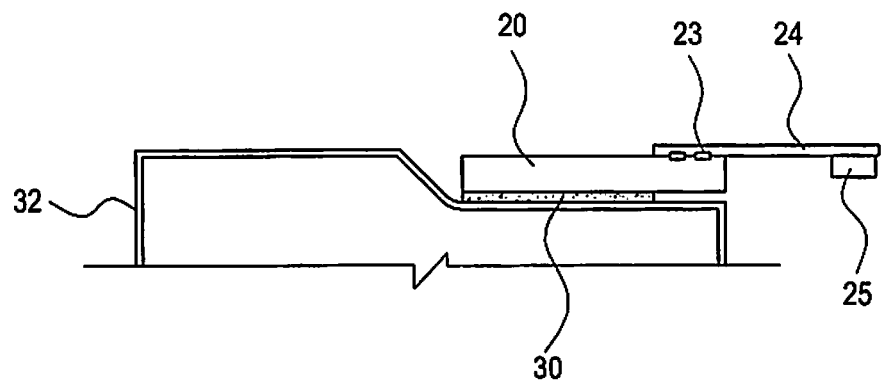
FIG. 4 is a sideview illustrating a large capacity memory module mounting device according to another embodiment of the present invention.

As illustrated in FIG. 4, a large capacity memory module 20 according to another embodiment of the present invention may be mounted to a shield can 32 to solve issues of Electromagnetic Interference (EMI) ElectroStatic Discharge (ESD). The connection of the large capacity memory module 20 and the flexible circuit board 24 has already been described, and its repeated description will be omitted.

The large capacity memory module 20, to which the flexible circuit board 24 is attached to the shield can 32 using a conductive material, for example, a conductive double-sided tape 30 to solve an electromagnetic field problem. One of contact pads in a wide area of the bottom surface of the large capacity memory module may be made of a Ground (GND) pad and be directly connected to the shield can using a conductive material, to solve the electromagnetic field problem. The conductive material may be a conductive double-sided tape, considering its convenience for mounting, attachment, and detachment.

As describe above, the present invention contributes to the slimness of a portable terminal due to the slim structure of a large capacity memory module mounting device. Further, a large memory module can be easily attached and detached to and from a desired object of a portable terminal, advantageously solving an electromagnetic problem.

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A large capacity memory module mounting device of a portable terminal, comprising:
   a large capacity memory module including a plurality of first contact pads disposed in recesses of a first surface of the large capacity memory module; and
   a flexible circuit board having a second surface directly contacting the surface of the large capacity memory module including a plurality of second contact pads disposed in recesses of the surface of the flexible circuit board and electrically connected to the large capacity memory module by forming solder pads within spaces comprising corresponding recesses of the first surface and the second surface in a heating process after the first and second contact pads are positioned in a face-to-face manner.

2. The large capacity memory module mounting device of claim 1, wherein the heating process is a hot bar process.

3. The large capacity memory module mounting device of claim 1, wherein the heating process is an Anisotropic Conductive Film (ACF) process.

4. The large capacity memory module mounting device of claim 1, wherein one of the first contact pads is a Test Pin (TP) pad.

5. The large capacity memory module mounting device of claim 1, wherein the large capacity memory module is attached and detached to and from a desired object of the portable terminal using a double-sided tape.

6. The large capacity memory module mounting device of claim 5, wherein the object is one of a spare space within the body housing of the portable terminal, a shield can, a battery pack, and an Liquid Crystal Display (LCD) module.

7. The large capacity memory module mounting device of claim 1, wherein the large capacity memory module includes an embedded printed circuit board package.

8. A large capacity memory module mounting device of a portable terminal, comprising:
   a large capacity memory module including a plurality of first contact pads disposed in recesses of a first surface of the large capacity memory module;
   a flexible circuit board having a second surface directly contacting the surface of the large capacity memory module including a plurality of second contact pads disposed in recesses of the surface of the flexible circuit board and electrically connected to the large capacity memory module by forming solder pads within spaces comprising corresponding recesses of the first surface and the second surface in a heating process after the first and second contact pads are positioned in a face-to-face manner;

a conductive material attached to the large capacity memory module; and a shield can connected to the large capacity memory module by the conductive material.

9. The large capacity memory module mounting device of claim 8, wherein the conductive material is a conductive double-sided tape.

10. The large capacity memory module mounting device of claim 1, wherein the large capacity memory module and the flexible circuit board are connected to each other by a hot bar process or an Anisotropic Conductive Film (ACF) process.

11. The large capacity memory module mounting device of claim 8, wherein a ground pad is provided on a bottom surface of the large capacity memory module so that the large capacity memory module is connected to the shield can by the conductive material.

* * * * *